United States Patent [19]

Pasco

[11] Patent Number: 5,515,011
[45] Date of Patent: May 7, 1996

[54] PULSED MAGNETRON CIRCUIT WITH PHASE LOCKED LOOP

[75] Inventor: Richard J. Pasco, South Williamsport, Pa.

[73] Assignee: Litton Systems Inc., Beverly Hills, Calif.

[21] Appl. No.: 100,821

[22] Filed: Aug. 2, 1993

[51] Int. Cl.⁶ .................................................. H03B 9/10
[52] U.S. Cl. ............................ 331/5; 331/17; 331/47;
331/173; 331/87; 331/90; 342/201; 342/202;
327/113; 375/312; 375/314; 332/132
[58] Field of Search ................................ 331/47, 5, 86,
331/87, 88, 90, 89, 173, 172, 8, 17, 23;
328/155; 307/106; 342/201, 202, 199, 203,
204; 375/312, 314; 327/40, 113, 123; 455/91,
113; 332/126, 127, 132

[56] References Cited

U.S. PATENT DOCUMENTS

| | | | |
|---|---|---|---|
| 2,724,778 | 11/1955 | Jasik | 331/5 |
| 3,514,718 | 5/1970 | Newton | 331/5 |
| 3,713,029 | 1/1973 | Uchida | 328/155 |
| 4,002,995 | 1/1977 | Reed | 331/1 A |
| 4,011,520 | 3/1977 | Schaefer | 331/1 A |
| 4,017,702 | 4/1977 | Harmon et al. | 331/86 |
| 4,250,454 | 2/1981 | Sakamoto | 328/155 |
| 4,571,552 | 2/1986 | Brown | 330/47 |
| 4,682,178 | 7/1987 | Anflo et al. | 342/202 |

*Primary Examiner*—Robert J. Pascal
*Assistant Examiner*—Arnold Kinkead

[57] ABSTRACT

A semiconductor diode is connected across the cathode-to-anode path of a magnetron and through a storage capacitor and collector resistor to a supply voltage for enabling charging of the capacitor. A control pulse causes a switching transistor to conduct to discharge the capacitor through its collector-to-emitter path, an emitter resistor, and the magnetron, for causing the latter to oscillate. A feedback signal representative of the difference between the magnetron output frequency and a reference frequency is applied to a linear amplifier transistor which conducts through the emitter resistor for controlling the current flow through the switching transistor and the operating frequency of the magnetron.

19 Claims, 2 Drawing Sheets

PULSED MAGNETRON CIRCUIT WITH PHASE LOCKED LOOP

This invention relates to method and apparatus for reducing the noise figure for a magnetron oscillator circuit and more particularly to a phase lock loop associated with a magnetron for controlling the oscillation frequency thereof.

A magnetron is essentially a pulsed oscillator that produces a high-power pulse signal of short duration. Although it is desirable that the magnetron oscillate at a particular single frequency during each RF output pulse, the magnetron is known to exhibit intrapulse frequency modulation, or "FM'g" or "twining" which adversely affects the noise figure of an associated system. The noise figure F of the system at a frequency f is defined as $$F(f) = \frac{P_{noise\ out}}{GP_{noise\ in}} \text{ where } P_{noise\ out} \text{ is the}$$

total noise power per unit bandwidth, at frequency f, delivered to the system at an output termination; G is the gain of the system at frequency f; and $P_{noise\ in}$ is the portion of the total noise engendered at a noise temperature of 290 Kelvin. Intrapulse FM'g or twining is essentially a jitter of the oscillation frequency of the magnetron during a particular RF output pulse. Operation of a magnetron at a single frequency is particularly important in applications where Doppler information is extracted during the pulse, and in applications such as weather radars that utilize wide pulses in order to reduce the side lobe distribution. Wide pulses have inherently narrow band widths, e.g., 100 KHz, however, and are consequently interfered with by the natural intrapulse FM'g of the magnetron during generation of an RF pulse. It will be noted that frequency variation (FM'g) within a particular magnetron output pulse is seldom greater than 1 MHz at an operating frequency of 10 GHz. It has been discovered that a significant reduction in system noise figure can be obtained by reducing intrapulse FM'g in the magnetron.

An object of this invention is the provision of improved method and apparatus for maintaining the operating oscillation frequency of a magnetron at a more nearly constant frequency during each output pulse therefrom.

Another object is the provision of a unique phase lock loop magnetron circuit for reducing FM'g in the output thereof.

DESCRIPTION OF DRAWINGS

This invention will be more fully understood from the following detail description of preferred embodiments thereof together with drawings in which.

DESCRIPTION OF PREFERRED EMBODIMENTS

Figure 1:
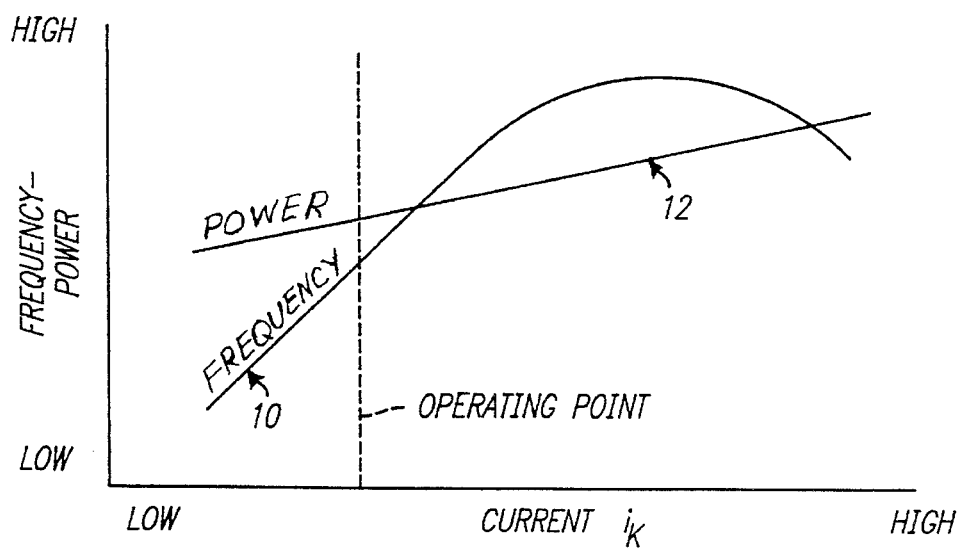
FIG. 1 is a typical pushing curve of a magnetron which is a plot of the variation in magnetron oscillation frequency as a function of anode current therein, and a plot of the variation of magnetron output power as a function of anode current therein.

A pushing curve 10 in FIG. 1 can be readily obtained for a particular magnetron oscillator. The curve 10 describes the change in operating frequency of the magnetron as a function of the cathode current in the magnetron. The curve 10 is generally linear over a substantial range of cathode currents. The other curve 12 in FIG. 1 illustrates the change in power in the RF output pulse of the magnetron as a function of cathode current. The curve 12 is also substantially linear over a significant portion thereof. An operating point of the magnetron is selected to require a sufficiently large cathode current to ensure stable oscillation of the magnetron, to provide the desired output power, and to provide a desired RF operating frequency that is in the linear range of the curves 10 and 12.

Figure 2:
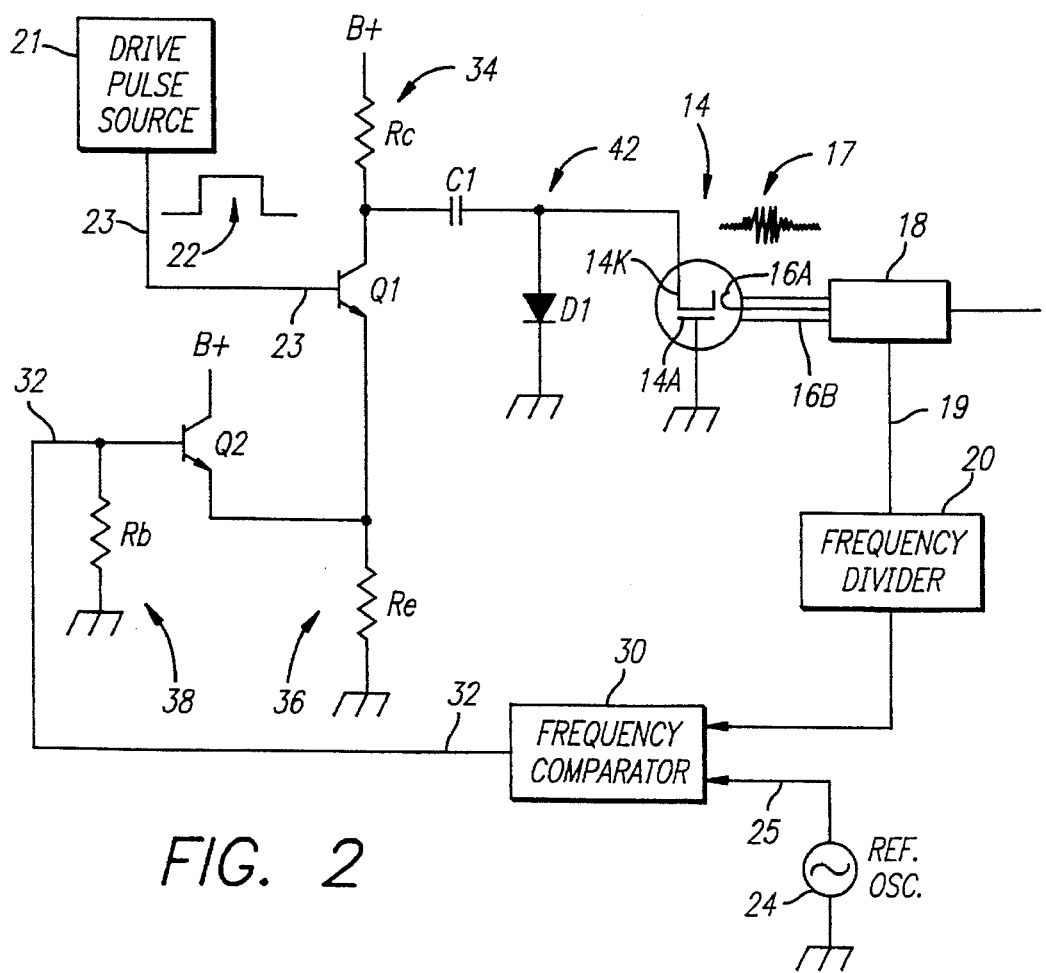
FIG. 2 is a schematic circuit and block diagram of one embodiment of this invention.

Referring now to FIG. 2, a phase lock loop embodiment of this invention is illustrated which maintains the cathode current in the magnetron, and thus the operating frequency thereof, substantially constant during generation of a particular RF pulse. The circuit in FIG. 2, comprises a magnetron 14 and a reference oscillator 24 connected in a phase lock loop configuration to a frequency comparator 30, a dual mode modulator 34 and a storage capacitor circuit 42. The circuit 42 comprises a large storage capacitor C1 and diode D1 that are electrically connected in series between ground and a positive supply voltage B+. The capacitor C1 and the diode D1 are connected such that the capacitor is charged toward the positive supply voltage when the magnetron is cut off. The supply voltage may be 2,000 volts or more. The capacitance of the storage capacitor may be in the order of several micro farads.

The magnetron is illustrated in schematic form in FIG. 2. The magnetron has an anode electrode 14A that is connected to a ground reference potential, a cathode electrode 14K that is electrically connected through the storage capacitor C1 to the positive supply voltage, and an RF output coupling loop 16A on an associated coaxial cable 16B. The magnetron is selected to operate at high values of anode current that are in the linear portion of the pushing characteristic 10 in FIG. 1, and at low values of power sensitivity described by curve 12. A typical value of pushing factor is 1 MHz per ampere at a magnetron oscillating frequency of 10 GHz. A pushing factor of as high as 100 MHz per ampere is readily obtainable from available magnetrons of various designs. The output power of the magnetron may be in the range of 1 to 4 kilowatts or more for a pulse width of from 25 nano seconds to 100 micro-seconds or more, and a pulse repetition frequency of 1Hz to 1 MHz or more. The output power variation of such a magnetron may be in the order of 200–400 peak watts per ampere of magnetron anode current.

A portion of the magnetron output signal is coupled by directional coupler 18 to a frequency divider 20 which converts it to a lower frequency signal that is applied to one input line of the frequency comparator 30. This makes it possible for the comparator to be a more economical circuit element such as an IF mixer. Alternatively the coupled signal on line 19 may be connected to the one input line of an appropriate frequency comparator. A reference frequency signal from source 24 is applied to the other input line to the comparator. The oscillator 24 is a very stable signal source. The comparator produces an output signal on line 32 that is proportional to the difference between the frequencies of the magnetron output pulse 17 and the reference signal.

The dual mode modulator 34 comprises a switching amplifier 36 and a linear amplifier 38. The switching amplifier comprises an NPN switching transistor Q1 having its emitter-collector path electrically connected between ground and the positive supply voltage through an emitter resistor Re and a collector resistor Rc. The Q1 collector electrode is also connected to one side of the storage capacitor C1. The switching transistor Q1 is responsive to a pulse 22 control voltage from source 21 on line 23 to its base electrode for operating in saturation. The drive pulse from source 21 determines the pulse width of the output pulses 17 from the magnetron, as is described more fully hereinafter.

The linear amplifier 38 may, by way of example, be an emitter follower comprising NPN transistor Q2 that has its emitter electrode connected through the emitter resistor Re to ground, and its collector electrode electrically connected to the positive supply voltage. The Q2 base electrode is connected on line 32 to the output of the comparator 30 and through a bias resistor Rb to ground. The emitter follower transistor Q2 is biased to operate in its linear region.

When a drive pulse 22 is absent from line 23 the switching transistor Q1 and the magnetron are cut off. This allows the diode D1 to conduct for charging C1 to substantially the positive supply voltage with a polarity that maintains the magnetron cut off.

When a drive pulse 22 is present on line 23 it rapidly drives Q1 into saturation for pulling its collector electrode toward the ground reference potential. This causes D1 to be cut off and impresses a large negative voltage of substantially minus |B+| onto the cathode 14K for causing the magnetron to rapidly turn on and oscillate as C1 slowly discharges through the Q1 collector-emitter path and the anode to cathode path of the magnetron.

The frequency of the RF output pulse signal from the magnetron is down converted in frequency divider 20 before it is applied to the comparator. A signal voltage that is proportional to the difference between the frequencies of the magnetron output signal and the reference frequency signal on line 25, and of the opposite sense, is produced on line 32. Current flow in the bias resistor Rb as a result of this signal voltage on line 32 forward biases Q2 to cause it to conduct current through Re that is proportional to, or related to, the frequency difference detected by the comparator. This Q2 transistor current in Re varies the bias on Q1, and thus the rate of discharge of C1 and the rate of conduction of current through Q1. Since C1 discharges through Q1, ground, and the anode to cathode path of the magnetron, this variation in the current in Q1 produces a corresponding change in the cathode current in the magnetron for pushing the magnetron oscillation frequency in the proper direction for maintaining this frequency constant. Thus the circuit of FIG. 2 suppresses the noise generated by FM'g of the magnetron output signal.

Figure 3:
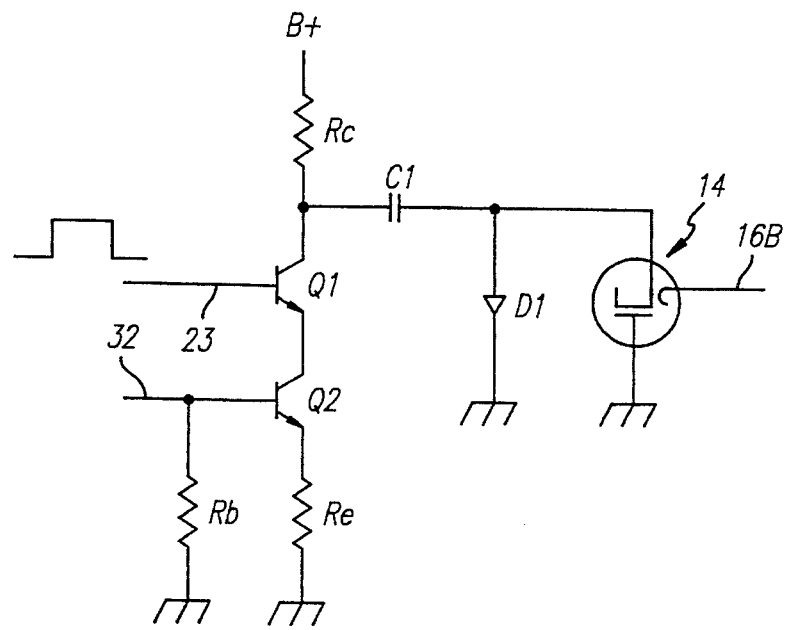
FIGS. 3–5 are schematic circuit and block diagrams of alternate embodiments of this invention.
Figure 4:
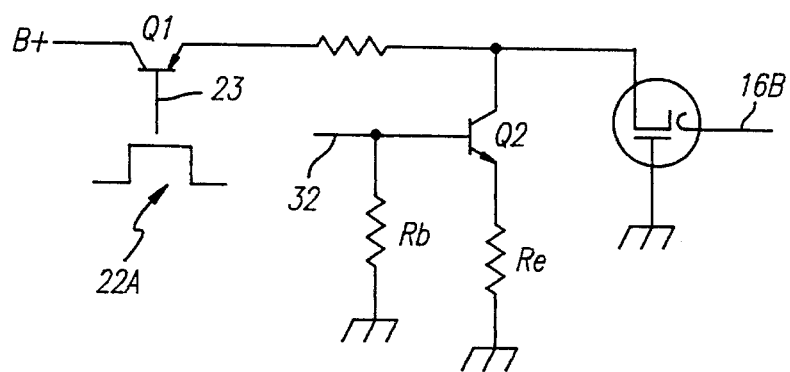

In an alternate embodiment of this invention in FIG. 3 the Q2 emitter is connected to the Q1 collector for simplifying the circuit. In the alternate embodiment in FIG. 4 the magnetron and emitter follower Q2 are connected in parallel and the capacitor and diode are omitted. In this FIG. 4 circuit Q1 conducts directly thru the Q2 collector-emitter junction and the magnetron's cathode to anode circuit in response to a control pulse 22A.

Figure 5:
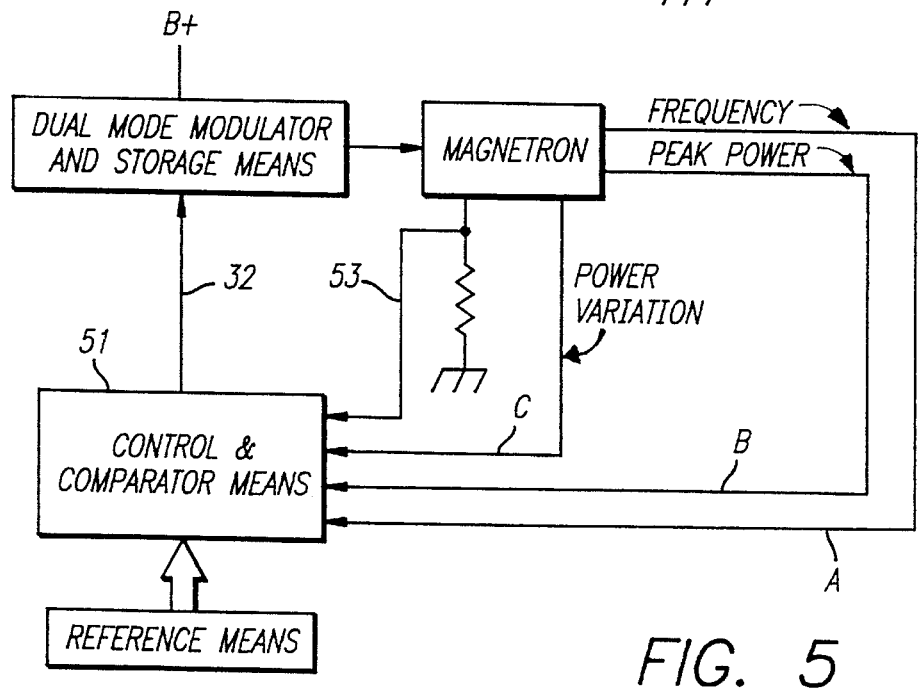

In the alternate embodiment in FIG. 5 signal representative of the RF output signal (frequency), the detected peak power, and the detected power variation of the output signal of the magnetron are applied on lines A, B and C, respectively, to a control computer 51. A voltage proportioned to the anode current is applied in line 53 to the control unit. Reference frequency and voltage signals are also applied to unit 51. The control computer references the magnetron output frequency to the reference frequency, and the indications of peak power output and power variation to the reference voltage for producing the appropriate control voltage on line 32.

Although this invention is described in relation to preferred embodiments thereof, variations and modifications will occur to those skilled in the art. By way of example, vacuum tubes may be employed instead of the solid state devices in FIG. 2. Further, the dual-mode modulator can be a multi-terminal device such as a tetrode or pentode vacuum tube, or a selected FET device. In a pentode, for example, the drive pulse would be applied to the screen grid electrode for turning it on and off, and the comparator output would be applied to the control grid for selectively linearly varying the conduction rate thereof. Additionally, the reference source may be a long-line interferometer, a phase bridge, a dielectric resonant disc, or a stabilizing cavity. Additionally, the frequency comparator may comprise a balanced demodulator or a lumped constant frequency discriminator, or a Weiss pulse frequency discriminator tuned to an intermediate frequency. Further, in a passive device the frequency comparator may be a resonant slope detector using resonant cavities and a crystal detector or a long line discriminator or long line interferometer or phase bridge, or dielectric resonant disc, or stabilizing cavity. The invention is also adaptable to average valve parameters. The scope of this invention is therefore to be determined from the appended claims rather from the above detailed descriptions.

What is claimed is:

1. A pulsed magnetron circuit comprising:

a pulsed magnetron having cathode and anode electrodes and producing an output signal on an output terminal, said pulsed magnetron selectively operating in a cut-off mode and in an oscillation mode for producing a microwave output signal;

a dual mode modulator means comprising a control element and being responsive to a control pulse on a first input terminal thereof for passing an electrical current through said control element;

a charge storage circuit means operative for impressive an electrical charge on a charge storage element thereof when a control pulse is absent from said first input terminal of said modulator means which maintains said pulsed magnetron in said cut-off mode, said modulator means being responsive to presence of a control pulse for discharging said charge storage element through said control element and said magnetron for providing electron current for causing the latter to operate in said oscillation mode;

comparator means responsive to a microwave reference signal and to one of the microwave output signal of said pulsed magnetron and a representation thereof for producing an output signal representative of the microwave frequency difference therebetween; and means for electrically connecting said microwave frequency difference signal from said comparator means to said control element for selectively varying the electrical current therethrough during receipt of a control pulse, and thus the current through said cathode-to-anode path of said pulsed magnetron, for controlling the microwave oscillation frequency of said pulsed magnetron.

2. The circuit according to claim 1 wherein said comparator means is a microwave frequency comparator means responsive to a microwave reference frequency signal and the frequency of the output signal of the pulsed magnetron.

3. The circuit according to claim 1 wherein said comparator means is operative for comparing an indication of the value of the microwave frequency power output of said pulsed magnetron with a reference voltage for producing an output signal representative thereof.

4. The circuit according to claim 1 wherein said comparator means is operative for comparing an indication of the power variation in the microwave output signal of said pulsed magnetron with a reference voltage for producing an output signal representative thereof.

5. The circuit according to claim 1 further comprising a source of supply voltage having terminals; and wherein said charge storage element is a capacitor and said charge storage circuit means further comprises a semiconductor diode connected across an anode-to-cathode path of said pulsed magnetron; said capacitor and diode being electrically connected in series across terminals of said source of supply voltage for charging said capacitor when a control pulse is absent from said dual mode modulator means.

6. A magnetron circuit comprising:
 a magnetron having cathode and anode electrodes and producing an output signal on an output terminal, said magnetron selectively operating in cut-off and oscillation modes;
 modulator means comprising a control element and being responsive to a control pulse on a first input terminal thereof for passing an electrical current through said control element;
 a charge storage circuit means operative for impressing an electrical charge on a charge storage element thereof when a control pulse is absent from said first input terminal of said modulator means which maintains said magnetron in said cut-off mode, said modulator means being responsive to a control pulse for discharging said charge storage element through said control element and said magnetron for providing electron current for causing the latter to operate in said oscillation mode;
 comparator means responsive to a reference signal and one of the output signal of said magnetron and a representation thereof for producing an output signal representative of the difference therebetween;
 means for electrically connecting said difference signal from said comparator means to said control element for selectively varying the electrical current therethrough during receipt of a control pulse, and thus the current through said cathode-to-anode path of said magnetron, for controlling the oscillation frequency of said magnetron; and
 a source of supply voltage having terminals;
 wherein said charge storage element is a capacitor and said charge storage circuit means further comprises a semiconductor diode connected across an anode-to-cathode path of said magnetron; said capacitor and diode being electrically connected in series across terminals of said source of supply voltage for charging said capacitor when a control pulse is absent from said modulator means; and
 wherein said modulator means comprises a first active element having one side connected to one terminal of said voltage source and to one side of said capacitor and having another side electrically connected through a bias resistor to the other side of said voltage source and having a control terminal receiving said control pulse; and a second active element biased to operate in a linear mode and having an input terminal receiving said difference frequency signal and having an output terminal electrically connected to said bias resistor for selectively controlling current flow through said bias resistor and said first active element when the latter is conducting.

7. The circuit according to claim 6 wherein said first active element comprises a switching transistor having an emitter electrode electrically connected through bias resistor, which is an emitter resistor, to said voltage source.

8. The circuit according to claim 7 wherein said second active element comprises an emitter-follower transistor means having its emitter electrically connected through said bias resistor to said voltage source for controlling the capacitor discharge current flowing through said switching transistor and pulsed magnetron.

9. The circuit according to claim 8 wherein said emitter follower transistor means has a collector electrode electrically connected to the emitter electrode of said switching transistor.

10. The circuit according to claim 1 wherein said dual mode modulator means comprises a first active element that is a switching element having one side connected to one side of a voltage source and to said charge storage element and having another side electrically connected through a bias resistor to another side of said voltage source and having a control terminal receiving said control pulse; and a linear amplifier means comprising a second active element biased to operate in a linear mode and having an input terminal receiving said difference signal from said comparator means and having an output terminal electrically connected to said bias resistor for selectively controlling current flow through said bias resistor and said first active element when the latter is conducting.

11. The circuit according to claim 10 wherein said first active element comprises a switching transistor means having an emitter electrode electrically connected through said bias resistor, which is an emitter resistor, to said voltage source, and having a base electrode which is connected to said control terminal.

12. The circuit according to claim 11 wherein said second active element comprises an emitter-follower transistor means having its emitter electrically connected through said bias resistor to said voltage source for controlling discharge current flowing from said charge storage element through said switching transistor means and magnetron.

13. The circuit according to claim 12 wherein said emitter follower transistor means has a collector electrode electrically connected to the emitter electrode of said switching transistor means.

14. The circuit according to claim 12 whereon said charge storage element is a capacitor and said charge storage circuit means further comprises a semiconductor diode electrically connected across an anode-to-cathode path of said magnetron; said capacitor and diode being electrically connected in series across terminals of said source of supply voltage for charging said capacitor when a control pulse is absent from said base electrode of said switching transistor means.

15. The circuit according to claim 1 wherein said dual mode modulator means comprises a switching amplifier means having one side connected to one side of a voltage source and to one side of said charge storage element and having another side electrically connected through a bias resistor to another side of said voltage source and having a control terminal receiving said control pulse; and further comprising a linear amplifier means biased to operate in a linear mode and having an input terminal receiving said difference signal and having an output terminal electrically connected to said bias resistor for selectively controlling current flow through said bias resistor and said switching amplifier means when the latter is conducting.

16. The circuit according to claim 15 wherein said switching amplifier means comprises a switching transistor means having an emitter electrode electrically connected through said bias resistor, which is an emitter resistor, to said voltage source and having a base electrode which is connected to said control terminal.

17. The circuit according to claim 16 wherein said linear amplifier means comprises an emitter-follower transistor means having its emitter electrically connected through said bias resistor to said voltage source for controlling discharge current flowing from said charge storage element through said switching transistor means and magnetron.

18. The circuit according to claim 17 wherein said emitter follower transistor means has a collector electrode electrically connected to the emitter electrode of said switching transistor means.

19. The circuit according to claim 17 wherein said charge storage element is a capacitor and said charge storage circuit means further comprises a semiconductor diode connected across an anode-to-cathode path of said magnetron; said capacitor and diode being electrically connected in series across terminals of said source of supply voltage for charging said capacitor when a control pulse is absent from said base electrode of said switching transistor means.

* * * * *